United States Patent
Komori et al.

(10) Patent No.: US 6,323,416 B1
(45) Date of Patent: *Nov. 27, 2001

(54) SOLAR CELL MODULE

(75) Inventors: Ayako Komori, Nara; Takahiro Mori, Ikoma; Ichiro Kataoka; Satoru Yamada, both of Kyotanabe; Hidenori Shiotsuka, Nara, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/926,937

(22) Filed: Sep. 10, 1997

(30) Foreign Application Priority Data

Sep. 12, 1996 (JP) .................................... 8-242399

(51) Int. Cl.⁷ .................... H01L 31/0203; H01L 31/045; H01L 21/302; A02N 6/00
(52) U.S. Cl. ......................... 136/259; 136/251; 52/173.3; 438/64; 454/900
(58) Field of Search .................... 136/251, 256, 136/259; 126/705, 706, 621, 622; 52/173.3; 438/64; 454/900

(56) References Cited

U.S. PATENT DOCUMENTS

| | | | |
|---|---|---|---|
| 4,341,607 | * 7/1982 | Tison | 204/129 |
| 4,499,658 | * 2/1985 | Lewis | 29/588 |
| 5,252,141 | * 10/1993 | Inoue et al. | 136/251 |
| 5,389,159 | * 2/1995 | Kataoka et al. | 136/251 |
| 5,530,264 | * 6/1996 | Kataoka et al. | 257/40 |
| 5,578,141 | * 11/1996 | Mori et al. | 136/251 |
| 5,589,006 | * 12/1996 | Itoyama et al. | 136/248 |
| 5,597,422 | * 1/1997 | Kataoka et al. | 136/259 |
| 5,650,019 | * 7/1997 | Yamada et al. | 136/251 |
| 5,660,646 | * 8/1997 | Kataoka et al. | 136/251 |

FOREIGN PATENT DOCUMENTS

| | | | |
|---|---|---|---|
| 2136790 | * 5/1995 | (CA) | H01L/31/058 |
| 0625802 | 11/1994 | (EP) . | |
| 2310539 | * 12/1976 | (FR) | F24J/3/00 |
| 62-33756 | 7/1987 | (JP) . | |
| 7-211932 | 8/1995 | (JP) . | |
| 7-288333 | 10/1995 | (JP) . | |
| 48299 | * 7/1991 | (JP) | E04B/1/74 |

* cited by examiner

Primary Examiner—Rena L. Dye
Assistant Examiner—Michael C. Miggins
(74) Attorney, Agent, or Firm—Fitzpatrick, Cella, Harper & Scinto

(57) ABSTRACT

A solar cell module includes a substrate, a photo-electricity generating device (i.e., a solar cell or a block of solar cells), a filler resin sealing the photo-electricity (generating device on the substrate, and a surface film covering the filler resin. An insulating film is inserted between the photo-electricity generating device and the substrate so as to be inside the substrate, and an inorganic fibrous sheet is inserted between the photo-electricity generating device and the surface film so as to be disposed inside the insulating film. The substrate is befit at a portion thereof free from the insulating film. The solar cell member thus provided can exhibit a long-term reliability for outdoor use because the moisture is affectively prevented from penetrating the solar cell.

21 Claims, 5 Drawing Sheets

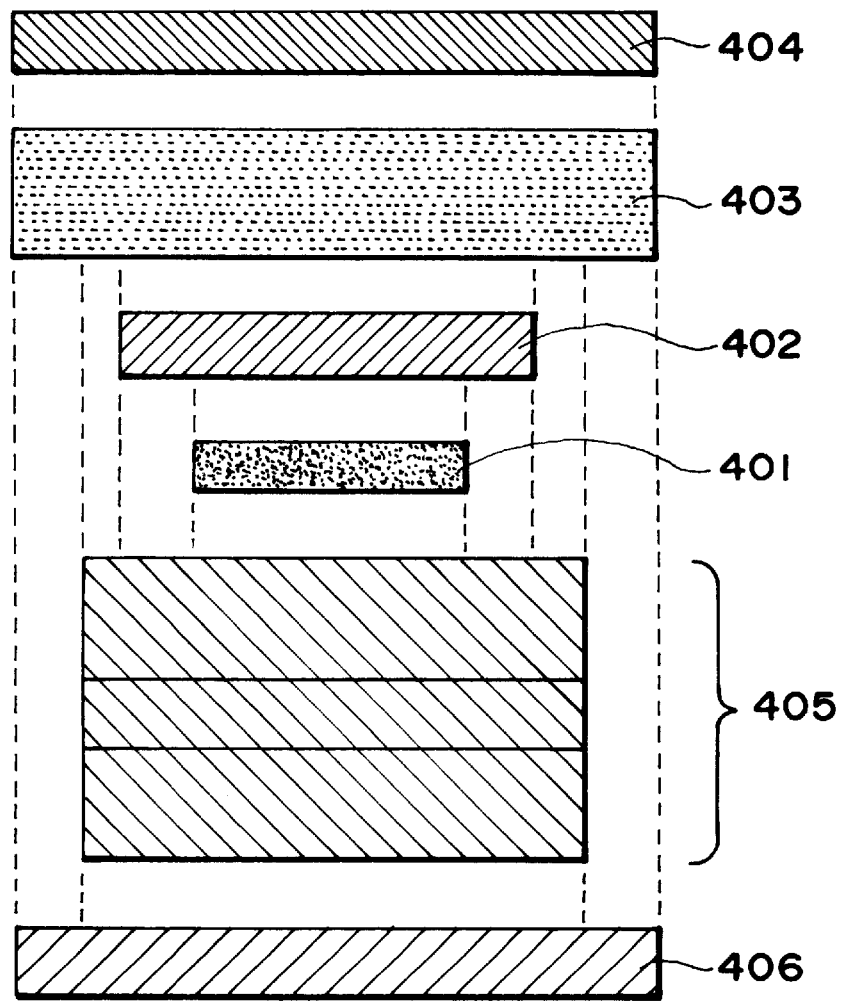
F I G. 4A
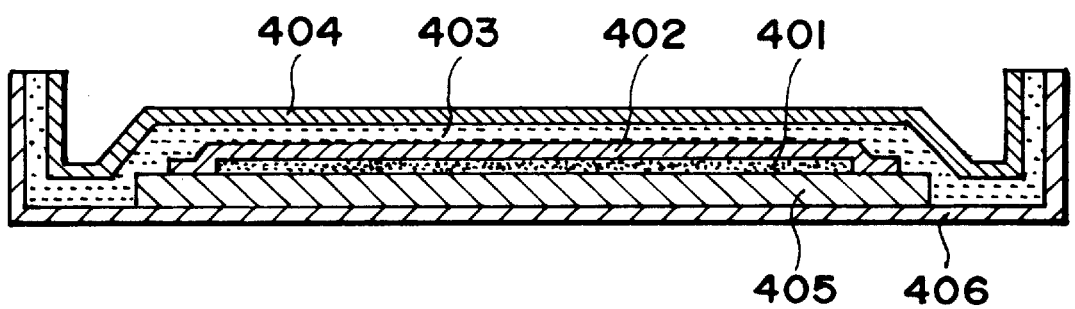
F I G. 4B

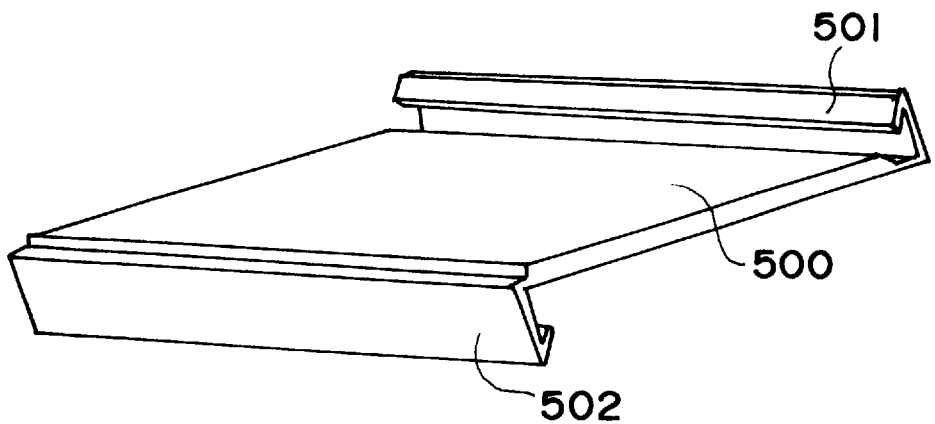
F I G. 5A
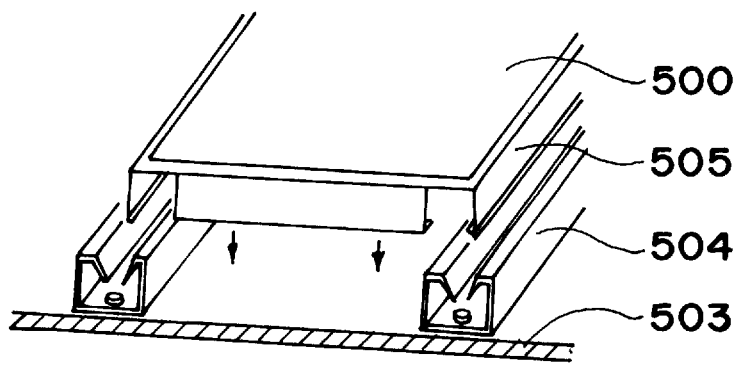
F I G. 5B
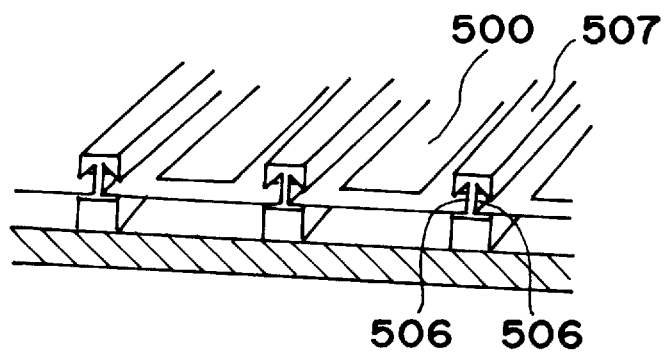
F I G. 5C

SOLAR CELL MODULE

FIELD OF THE INVENTION AND RELATED ART

The present invention relates to a solar cell module including a photo-electricity generating device (i.e., a solar cell or a block of solar cells) fixed with a resin onto a substrate and covered with a surface film. More specifically, the present invention relates to a solar cell module having extremely low inflammability and excellent moisture resistance and also a bent structure suitable for assembly.

Hitherto, a type of solar cell module including a photo-electricity generating device fixed onto a substrate with a resin and covered with a surface film has been known. As the resin, EVA (ethylene-vinyl acetate copolymer) has been widely used. As the surface film, it has been known to use a film of a fluorine-containing resin, such as tetrafluoroethylene-ethylene copolymer or polyvinyl fluoride, or a transparent fluorine-containing polymer film formed by coating with a fluorine-containing resin paint.

Such a solar cell module having a fluorine-containing polymer as a light-incidence side surfacemost coating material has an inferior scratch resistance compared with a solar cell module comprising a glass substrate as a light-incidence side surface material. Accordingly, it has been known to incorporate an inorganic fibrous sheet such as a non-woven glass fiber cloth, within an organic polymeric resin as a filler to form a surface coating material.

However, where the inorganic fibrous sheet such as glass fiber is exposed to an edge of the solar cell module, external moisture is liable to intrude to lower the electrical insulation or cause a peeling of the laminated module and provide an inferior appearance. This is presumably because the inorganic fibrous sheet comprising, e.g., glass fiber and the filler resin impregnating the glass fiber have a low adhesion with each other so that the moisture intrudes along the glass fiber.

As a countermeasure, it has been proposed to prevent the exposure of the glass fiber material to an edge of the solar cell module or to use a glass fiber material having less end portions. For example, Japanese Patent Publication (JP-B) 62-33756 has disclosed a solar cell module wherein a glass fiber sheet material with a small end portion is disposed on both sides of a solar cell and the end portion thereof is sealed within a filler resin.

Thus, JP-B 62-33756 has proposed to use a long-fiber glass fiber material having a small end portion selected from limited materials, such as continuous strand mat, glass cloth and rolling cloth. No consideration has been given to an insulation between the solar cell and the substrate on which the solar cell is disposed.

Japanese Laid-Open Patent Application (JP-A) 7-288333 has disclosed a solar cell module wherein a light-transmissive non-woven cloth (glass fiber cloth) in contact with a solar cell is disposed inside of edges of the solar cell module, and an insulating film is disposed between the solar cell and the module substrate. However, the insulating film is disposed to protrude out of the module substrate, and no consideration has been given to bending of the module substrate.

When a substrate of a solar cell module including a solar cell sealed with a filler resin on a substrate and a surface film coating the filler resin is bent, a stress is applied to the filler material and the surface film at the bent portion to cause peeling. In a conventional solar cell module having such a structure, a decrease of electrical insulation is inevitably caused when used outdoors for a long period even if the end portion of the glass fiber is prevented from being exposed at the edge of the module and a silane coupling agent is applied to the glass fiber and the surface film.

SUMMARY OF THE INVENTION

A principal object of the present invention is to provide a solar cell module capable of effectively suppressing the moisture intrusion into the interior of the solar cell module even in a long period of outdoor use.

According to the present invention, there is provided a solar cell module, comprising: a substrate, a photo-electricity generating device, a filler resin sealing the photo-electricity generating device on the substrate, and a surface film covering the filler resin; wherein an insulating film is inserted between the photo-electricity generating device and the substrate so as to be inside the substrate, an inorganic fibrous sheet is inserted between the photo-electricity generating device and the surface film so as to be disposed inside the insulating film, and the substrate is bent at a portion thereof free from the insulating film.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B are views corresponding to FIGS. 1A and 1B, respectively, for illustrating another embodiment of the solar cell module according to the invention.

FIGS. 5A–5C illustrate an embodiment of the roofing member according to the invention.

DESCRIPTION OF THE PREFERRED EMBODIMENTS

Figure 1A:
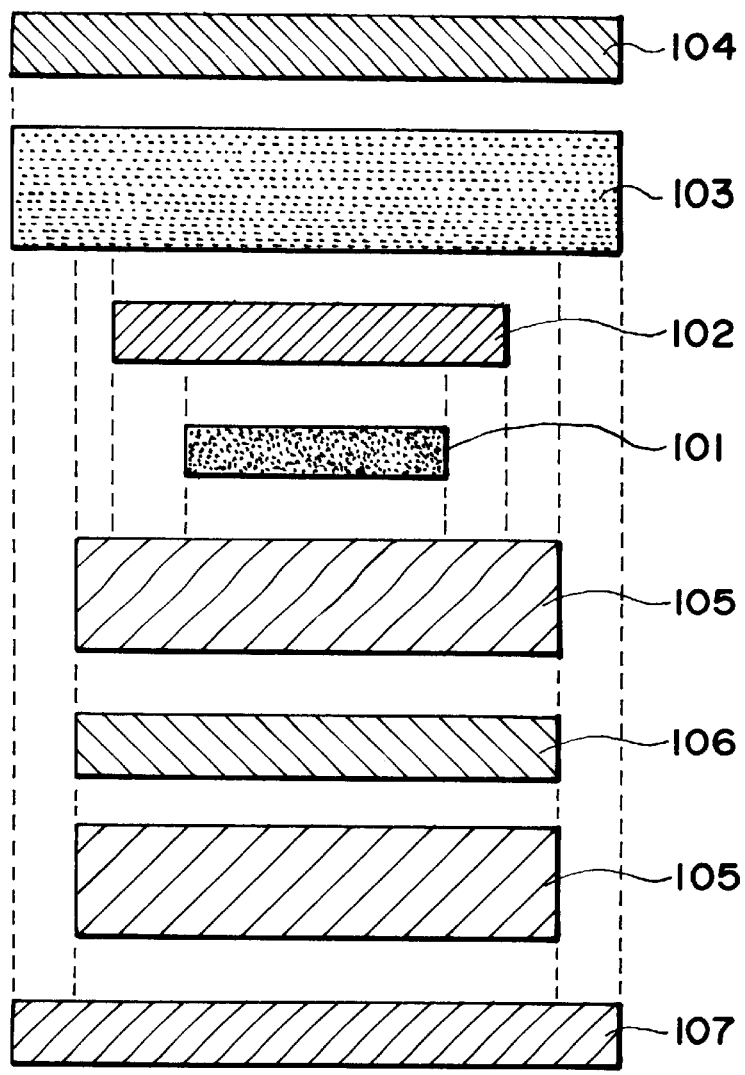
FIG. 1A illustrates members constituting a solar cell module according to the invention with their relative sizes.
Figure 1B:
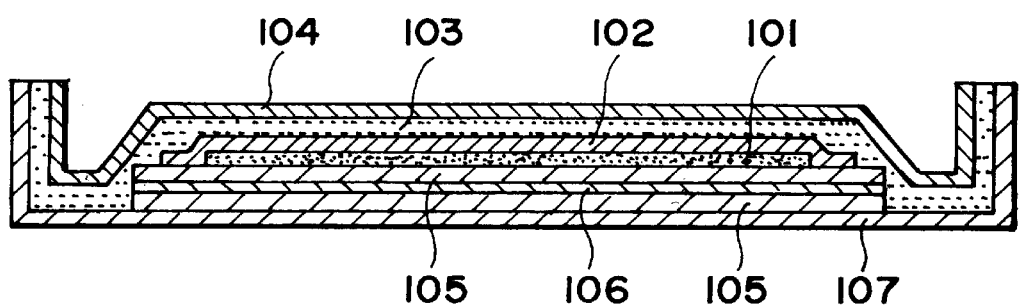
FIG. 1B is a sectional view of the solar cell module showing the members in a laminated form.

FIGS. 1A and 1B illustrate an embodiment of the solar cell module according to the present invention. Referring to these figures, the solar cell module includes a photo-electricity generating device (i.e., a solar cell or a block of solar cells) 101, an inorganic fibrous (sheet) material 102, a filler resin 103, a surface film 104, an adhesive 105, an insulating film 106 and a substrate 107. These members are stacked in the order illustrated in FIG. 1A and formed into a solar cell module having a laminate sectional structure as shown in FIG. 1B.

In a preferred embodiment, the relative areal (or planar) sizes of the respective members may be set as follows. The inorganic fibrous sheet 102 is set as follows. The inorganic fibrous sheet 102 is larger than the photo-electricity generating device 101 to cover the photo-electricity generating device 101. The insulating film 106 has an almost identical size as the adhesive 105 and is larger than the inorganic fibrous sheet 102. The substrate 107, the filler resin 103 and the surface film 104 have almost identical sizes and are larger than the insulating film 106. The filler resin 103 and the surface film 104 may be somewhat larger than the substrate 107 to cover edges of the substrate 107.

As the inorganic fibrous sheet 102 is disposed inside the edge(s) of the insulating film 106 together with a bent substrate structure as described hereinafter, it becomes possible to provide a solar cell module free from moisture intrusion even after a temperature-humidity cycle test and a long period of outdoor use, thus providing a reliable solar cell module free from a decrease in electrical insulation performance.

Hereinbelow, details of the respective members will be described.

Inorganic Fibrous Sheet 102

The inorganic fibrous sheet 102 may preferably be larger in planar size than the photo-electricity generating device 101. The inorganic fibrous sheet 102 has a function of promoting degassing from the module laminate at the time of preparation thereof by lamination. If it is smaller than the photo-electricity generating device, the cell cannot be sufficiently prevented from an external impact, and the degassing from the module at the time of lamination is liable to be insufficient leaving bubbles within the module.

It is also preferred that the inorganic fibrous sheet 102 is smaller in planar size than the substrate 107 and not extended up to the edge of the module. If the inorganic fibrous sheet 102 is identical or larger in size than the substrate 107 to be exposed to the module edge, external moisture will intrude into the module, along the fiber, thereby promoting the deterioration or peeling of the coating material. Further, as a result of the moisture, the electrical insulation between the inner portion and the exterior is decreased. This is because the inorganic fibrous sheet 102 and the filler resin 103 show a rather weak adhesion to each other so that the boundary between them is liable to provide a flow path and the moisture penetrates along the inorganic sheet 102. Further, even if the inorganic fibrous sheet 102 does not reach the module edge, if the inorganic fibrous sheet 102 continually extends from above the photo-electricity generating device 101 to the substrate 107, moisture can migrate along the inorganic fibrous sheet 102 to provide an electroconductive path between the substrate 107 and the photo-electricity generating device 101, thus failing to ensure the electrical insulation in some cases.

Further, it is preferred that the inorganic fibrous sheet 102 is smaller than the insulating film 106 rather than having an identical size as the insulating film 106. Hitherto, the surface film 104 and the filler resin 103 can buckle after bending to result in peeling or cracking at the bend, thereby causing moisture intrusion. According to the present invention, the inorganic fibrous sheet 102 liable to provide a moisture migration path is formed in a smaller size than the insulating film 106 so that, even when the substrate 107 is bent at a position closer to the photo-electricity generating device 101 and outside the insulating film 106, it is possible to reduce considerably the possibility that the penetrating moisture reaches the photo-electricity generating device 101, thus providing an improved long-term reliability. If it is possible to bend the substrate 109 at a position closer to the photo-electricity generating device 101, the solar cell module according to the present invention, when used as a roofing sheet member, can include the photo-electricity generating device fully up to the working width of the roofing sheet, so that a smaller number of roofing sheets can generate a sufficient amount of electric power.

The adhesion between the inorganic fibrous sheet 102 and the filler resin 103 can be increased considerably if one or both of them are surface-treated with a silane coupling agent. However, the effect of the treatment has a certain limit, and can lead to a lower adhesion after a long-term outdoor exposure or a temperature-humidity cycle test corresponding thereto.

A solution to this problem given by the present invention is to dispose the inorganic fibrous sheet 102 in a smaller size than the insulating film 106. As a result, a portion of the adhesive layer 105 bonding the solar cell 101 and the insulating film 106 can directly contact the filler resin 103 without the intermediate inorganic fibrous sheet 102. This provides an improved packaging effect for the photo-electricity generating device 101, and prevents the formation of a moisture migration path connecting the photo-electricity generating device 101 and the substrate 107, thus ensuring an electrical insulation even after a long-term outdoor use or a temperature-humidity cycle test corresponding thereto. Further, it is also possible to prevent the generated electricity from leaking out and to provide a solar cell module with an improved safety in actual use.

Further, as the inorganic fibrous sheet 102 and the insulating film 106 are not present at the bending portion, bending becomes easier, and inferior appearance, such as turbidity at the bend, can be prevented.

The inorganic fibrous sheet 102 used in the present invention is required in order to reduce the amount of the filler resin, provide an improved scratch resistance and provide an improved non-flammability. Further, in the case of a large-sized solar cell module of roofing-type or wall installation-type, the inorganic fibrous sheet 102 is very effective for de-aeration within the module at the time of lamination.

The inorganic fibrous sheet 102 may suitably comprise various non-woven glass fiber cloths without a particular limitation. It is preferred to use an acrylic resin as a binder for binding individual glass fibers. It is further preferred to surface-treat the inorganic fibrous sheet with a silane coupling agent.

The inorganic fibrous sheet 102 may preferably have a thickness of 150–450 $\mu$m and comprise glass fibers having a fiber diameter in a range of 5–15 $\mu$m.

Filler Resin 103

The filler resin 103 is used to coat the unevennesses of the photo-electricity generating device 101 and protect the cell from severe environmental conditions, such as a temperature change, humidity and an impact, while ensuring the adhesion between the cell 101 and the surface film 104. Accordingly, the filler resin is required to exhibit weather resistance, adhesivenness, filler characteristic, heat-resistance, cold-resistance, and impact resistance. Examples of resins satisfying such requirements may include: polyolefin-type resins, such as ethylene-vinyl acetate copolymer (EVA), ethylene-methyl acrylate copolymer (EMA), ethylene-ethyl acrylate copolymer, and polyvinyl butyral resin, urethane resin, silicone resin, and fluorine-containing resin. Among these, EVA has well-balanced properties for use in solar cells and may be preferably used.

The filler resin 103 may provide a thin filler resin portion where the inorganic fibrous sheet 102 is not present at a non-elasticity-generating region when the solar cell 101 is not present. The thickness of the thin-filler resin portion comprising the filler resin 103 but no inorganic fibrous sheet 102 may preferably be smaller than that of a layer including the filler resin 103 and the inorganic fibrous sheet 102 at an electricity-generating region. The module substrate 107 may desirably be bent at the thin-filler resin portion.

The filler resin 103 in its straight form has a rather low heat-distortion temperature and can readily cause distortion or creeping at an elevated temperature, so that it is preferred to crosslink the filler resin to provide an enhanced heat resistance. EVA may generally be crosslinked in the presence of an organic peroxide. Crosslinking with an organic peroxide may be initiated by extraction of a hydrogen or chlorine atom from a resin by a free radical generated from the organic peroxide to form a C—C bond. The organic peroxide may be activated by thermal decomposition, redox decomposition or ionic decomposition. Thermal decomposition is generally preferred. Examples of the organic peroxide structures may include: hydroperoxide, dialkyl (allyl) peroxide, diacyl peroxide, peroxyketal, peroxyester, peroxy carbonate and ketone peroxide. The organic peroxide may be used in 0.5–5 wt. parts per 100 wt. parts of the filler or sealing resin 103.

These organic peroxides may be used in a mixture with the filler resin to effect crosslinking and heat-pressure bonding under heat and pressure in vacuum. The heating temperature and time may be determined depending on the thermal decomposition temperature of the organic peroxide used, but the heating and pressure may be generally completed at a temperature and for a period sufficient to cause at least 90%, more preferably at least 95%, of the decomposition.

The crosslinking of the filler resin may generally be determined by measuring a gel content given by the following equation:

Gel content (wt. %)=[Insoluble resin weight/Original resin weight]×100.

More specifically, when a filler is extracted for, e.g., 6 hours with a solvent, such as xylene, in an amount of, e.g., 100 ml per g (gram) of the filler at a boiling point of e.g., 135–145° C. only the non-crosslinked sol portion can be dissolved to leave an insoluble gel content. Accordingly, a gel content of 100% means the completion of crosslinking. The sample remaining after the extraction may be recovered to evaporate the xylene therefrom, e.g., at 85° C. for 6 hours to selectively recover an insoluble gel matter. A gel content may be calculated by substituting the insoluble matter weight and the original sample weight into the above equation.

In order to effectively prevent a distortion of the filler resin at an elevated temperature, the filler resin may preferably have a gel/content as measured in the above-described manner of at least 70 wt. %.

In order to effectively cause the crosslinking reaction, it is also possible to use a crosslinking agent, such as triallyl isocyanurate (TAIC), in an amount of ordinarily 1–5 wt. parts per 100 wt. parts of the filler or sealing resin.

The filler resin as specifically mentioned above generally has excellent weather resistance but can further contain an ultraviolet absorber for further improved weather resistance or for protection of lower layers. The ultraviolet absorber may comprise a known compound but may be preferably a low-volatility ultraviolet absorber in view of the service environment of the solar cell module. Specific examples thereof may include ultraviolet absorbers of the benzophenone-type, benzotriazole-type and cyanoacrylate-type.

The addition of a light stabilizer together with an ultraviolet absorber may provide a further light-stable filler resin. Representative light-stabilizers may include hindered amine-type light stabilizers. A hindered amine-type light stabilizer does not absorb ultraviolet rays but exhibits a synergistically stabilizing effect when used in combination with an ultraviolet absorber. Other light stabilizers may also be used but may not be as preferred as the hindered amine-type light stabilizer because many of them are colored.

The above-mentioned ultraviolet absorber and light-stabilizer may preferably be used in proportions of 0.1–1.0 wt. % and 0.05–1.0 wt. %, respectively, of the filler resin.

The filler resin can further contain an antioxidant in order to improve the heat resistance and thermal processability. The antioxidant may be of the mono-phenol type, bis-phenol type, polymeric phenol type, sulfur type and phosphoric acid type. Such an anti-oxidant may preferably be added in an amount of 0.05–1.0 wt. % of the filler resin.

When the solar cell module is used in a severe environment, it is preferred to enhance the adhesion of the filler resin 103 to the surface film 104 and/or the lower layers including the inorganic fibrous sheet 102. For this purpose, it is effective to use a silane coupling agent. Specific examples of silane coupling agents may include: vinyltrichlorosilane, vinyltris (β-methoxyethoxy) -silane, vinyltriethoxysilane, vinyltrimethoxysilane, γ-methacryloxypropyltrimethoxysilane, β-(3,4-epoxycyclohexyl) ethyltrimethoxysilane, γ-glycidoxy-propylmethyldiethoxysilane, N-β(aminoethyl)-γ-aminopropyltrimethoxysilane, N-β(aminoethyl)-γ-aminopropyltrimethyldimethoxysilane, -γ-amino-propyltriethoxysilane, N-phenyl-γ-aminopropyltri-methoxysilane, γ-mercaptropropyltrimethoxysilane, and γ-chloropropyltrimethoxysilane.

Such a silane coupling agent may preferably be added in an amount of 0.1–3 wt. parts, more preferably 0.25–1 wt. parts, per 100 wt. parts of the filler resin.

On the other hand, in order to minimize the attenuation of light quantity reaching the photo-electricity generating device 101, the filler resin 103 has to be essentially transparent. More specifically, the filler resin 103 may desirably have a transmittance of at least 80%, preferably at least 90%, for a visible wavelength region of 400–800 nm. Further, for allowing easy incidence of light through the atmosphere, the filler resin 103 may preferably have a refractive index at 25° C. of 1.1–2.0, more preferably 1.1–1.6.

The filler resin 103 may preferably be provided in a sheet form having a thickness sufficient to provide an amount that is, e.g., 7–23 times that of the inorganic fibrous sheet 102 for an identical planar size.

Some EVA sheets for solar cells prepared by forming EVA containing additives as described above into sheets are already commercially available. Examples of the commercially available EVA sheets for solar cells may include "SOLAR EVA" available from Hi-Sheet Kogyo K.K., "EVASAFE WG Series" available from Bridgestone K.K. and "PHOTOCAP" available from Springborn Laboratories, Inc. A commercially available EVA sheet of these suppliers may be inserted between a surface film and an inorganic fibrous sheet covering a photo-electricity generating device and pressed under heating to easily provide a solar cell module.

Surface Film 104

The surface film 104 constitutes a surface-most layer of the solar cell module according to the present invention and accordingly is required to exhibit performances ensuring a long-term reliability for outdoor exposure of the solar cell module, including transparency, weather resistance, stain resistance and mechanical strength. The material suitably used in the present invention may comprise white sheet reinforced glass, a fluorine-containing resin film or acrylic resin film. The white sheet reinforced glass has a high transparency, comprising an impact-containing resin film or acrylic refine film. The white sheet reinforced glass has a high transparency, is impact-resistant and is not readily broken, so that it has been widely used as a surfacing material for a solar cell module.

Now, however, a module is often required to be light and flexible. In such cases, a film surface member is used. Among others, a fluorine-containing resin film may preferably be used because of excellent weather and stain resistance. Specific examples of the fluorine-containing resin may include polyvinylidene fluoride resin, polyvinyl fluoride resin and tetrafluoroethylene-ethylene copolymer. Polyvinylidene fluoride is excellent in weather resistance, and tetrafluoroethylene-ethylene copolymer is excellent in harmonization of weather resistance, mechanical strength and transparency. The surface film should have a certain thickness in order to ensure a mechanical strength and should not be too thick in view of the production cost. The thickness may preferably be 20–200 $\mu$m, more preferably 30–100 $\mu$m.

In order to improve the adhesion with the filler resin 103, one surface (non-exposed surface) of the surface film may preferably be subjected to corona treatment, plasma treatment, ozone treatment, irradiation with UV rays, irradiation with electron rays, or flame treatment. Among these, the plasma discharge treatment is especially suitable because of a large processing speed and a substantial improvement in adhesion by using a relatively simple apparatus.

Adhesive 105

The adhesive (layer) 105 used on a light non-receiving side of the module may comprise a material similar to that of the filler resin 103 disposed on the light receiving side. As shown in FIGS. 1A and 1B, the adhesive layer 105 may desirably be disposed in a smaller area than the filler resin 103, so that the bending portion of the module has a smaller thickness to facilitate bending and provide an improved non-flammability.

The adhesive layer 105 disposed on the light non-receiving side is required not to result in a decrease of adhesion of the photo-electricity generating device 101 to the insulating film 106 and the substrate 107 when subjected to light and heat, outdoor use or a temperature-humidity cycle test, unlike non-coloration when subjected to light, heat, etc. required on the light receiving side.

When a coated galvanized sheet steel coated with an organic polymer and having excellent weather and rust resistance is used as a substrate 107, it shows a particularly weak adhesion and leads to a problem regarding long-term reliability. The coating organic polymer may comprise, e.g., polyolefin-based resins, such as ethylene-vinyl acetate copolymer (EVA), ethylene-methyl acrylate copolymer (EMA), ethylene-ethyl acrylate copolymer (EEA), polyethylene and butyrai resin, urethane resin, silicone resin, and flexible epoxy resin adhesive. In such a case, it is preferred to apply an adhesive on the polymer coating as follows.

Thus, preferred example of the adhesive used for this purpose may include: polyolefin-based resins such as ethylene-vinyl acetate copolymer (EVA), ethylene-methyl acrylate copolymer (EMA), ethylene-ethyl acrylate copolymer (EEA), and butyral resin, urethane resin, and silicone resin, blended with a tackifier resin, examples of that may include: coumarone-indene resin, phenol-formaldehyde resin, polypentene resin, xylene-formaldehyde resin, polybutene, rosin, rosin-pentaerythritol ester, rosin-glycerin ester, hydrogenated rosin, hydrogenated rosin methyl ester, hydrogenated rosin pentaerythritol ester, hydrogenated rosin triethylene glycol ester, polymerized rosin ester, aliphatic petroleum resin, alicyclic petroleum resin, synthetic polyterpene, pentadiene resin, $\alpha$-pinene, $\beta$-pinene, dipentene resins, and terpene-phenol resin.

The adhesive layer 105 may be in a thickness of, e.g., 200 $\mu$m or larger.

Insulating Film 106

The insulating film 106 is required to ensure electrical insulation between the electroconductive substrate of the photo-electricity generating device 101 and the exterior. The insulating film 106 is disposed so as not to be present at the bending portion of the substrate, thereby suppressing a stress occurring at the bending portion and preventing the occurrence of ugly white turbidity at the bending portion. This is also effective for providing the resultant module with improved weather resistance. The insulating film 106 may preferably comprise a material that ensures a sufficient electrical insulation of the electroconductive substrate, has long-term durability against thermal expansion and thermal shrinkage, and is flexible. Suitable examples of the film materials may include nylon, polycarbonate and polyethylene terephthalate. The insulating film 106 may preferably have a thickness sufficient to provide a dielectric withstand voltage of at least 10 kV, e.g., ca. 50 $\mu$m or larger for a polyethylene terephthalate film. In order to simplify the lamination process, it is possible to use a laminate sheet prepared in advance and including an insulating film 106 and adhesive layers 105 as described above laminated on both sides of the insulating film 106.

Substrate 107

The substrate 107 is required to ensure a mechanical strength of the solar cell module and prevent the occurrence of strain or warp of the module caused by a temperature change. More specifically, the substrate 107 may preferably comprise a steel sheet, a plastic sheet or an FRP (fiber-reinforced plastic) sheet. Particularly, a module having a steel sheet substrate 107 has excellent processability, such as bendability, and can be formulated into a product without including a further step of frame attachment as has been exercised heretofore. The module can constitute a solar cell module integrated with a roofing member or a walling member. This is very advantageous for reducing the production cost and simplifying the production step. Further, by using a steel sheet coated with an organic polymer resin as the substrate, it is possible to provide a highly reliable solar cell module excellent in weather resistance and rust resistance.

By forming the substrate 107 in a size larger than any other layers forming the module except for the filler resin layer 103 and the surfacemost transparent film 104 disposed on the light-receiving side, it is possible to provide a solar cell module with a readily bendable peripheral portion. As a result, the solar cell module is provided not only with an excellent initial appearance but also with excellent appearance free from peeling or whitening at the bend even after a long-term outdoor use, thus producing a highly reliable solar cell module. When a flexible solar cell module is required, the substrate 107 may comprise a plastic film.

Photo-electricity Generating Device 101

Figure 2:
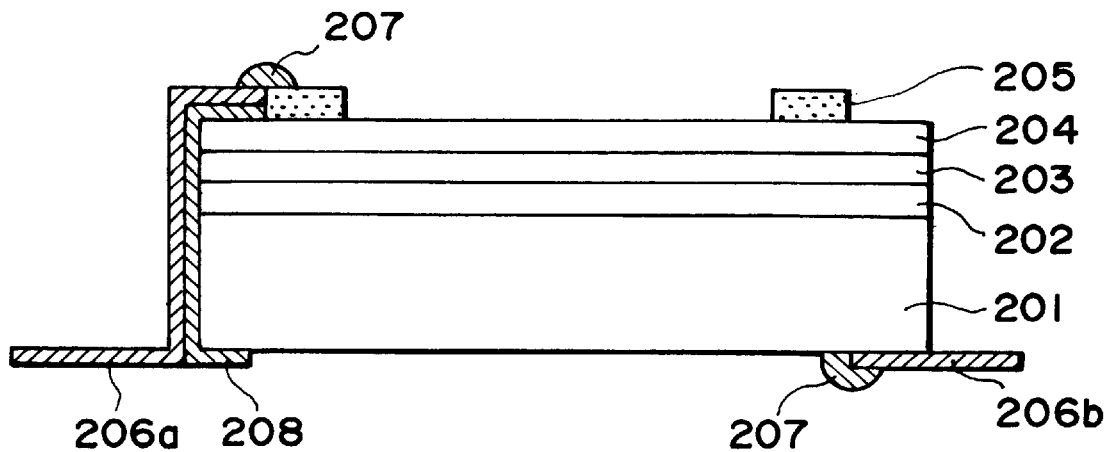
FIG. 2 is a sectional illustration of a photo-electricity generating device (solar cell) incorporated in the solar cell module shown in FIGS. 1A and 1B.

The photo-electricity generating device 101 may comprise, e.g., a crystalline silicon solar cell, a polycrystalline silicon solar cell, an amorphous silicon solar cell, or a compound semiconductor solar cell comprising, e.g., copper-indium-selenide, and need not be particularly limited. FIG. 2 is a sectional illustration of such a solar cell including a semiconductive photoactive layer (photoconversion member) and a transparent conductor layer. Referring to FIG. 2, a solar cell includes an electroconductive substrate 201, a back-side reflection layer 202, a semiconductive photoactive layer 203, a transparent conductor layer 204, a collector electrode 205, and an output terminal 206.

The electroconductive substrate 201 constitutes a substrate of the solar cell and also functions as a lower electrode. The substrate 201 may comprise, e.g., silicon, tantalum, molybdenum, tungsten, stainless steel, aluminum, copper, titanium, carbon sheet, lead-plated steel sheet, or a film or ceramic provided with an electroconductive layer. The electroconductive substrate 201 may be provided with a back-side reflection layer 202 that may comprise a metal layer, a metal oxide layer, or a laminate of a metal layer and a metal oxide layer. The metal layer may comprise, e.g., Ti, Cr, Mo, W, Al, Ag or Ni. The metal oxide layer may comprise, e.g., ZnO, $TiO_2$ or $SnO_2$. The metal layer and metal oxide layer may be formed by, e.g., resistance-heating evaporation, electron-beam evaporation, or sputtering.

The semiconductive photoconductive layer 203 is a layer for effecting a photo-electric conversion. The layer 203 may comprise, e.g., pn-junction polycrystalline silicon, pin-junction amorphous silicon, or a compound semiconductor, such as $CuInSe_2$, CuInS, GaAs, $CdS/Cu_2S$, CdS/CdTe, CdS/InP, or $CdTe/Cu_2Te$. The semiconductive photoactive layer 203 may for example be formed by formation into sheet of fused silicon or heat treatment of amorphous silicon in the case of polycrystalline silicon; by plasma CVD process for amorphous silicon; or by ion plating, ion beam deposition, vacuum evaporation, sputtering or electro-deposition.

The transparent conductor layer 204 functions as an upper electrode of the solar cell and may comprise, e.g., $In_2O_3$, $SnO_2$, $In_2O_3$—$SnO_2$ (ITO), ZnO, $TiO_2$, $Cd_2SnO_4$ or crystalline semiconductor doped with a high concentration of impurities. The transparent conductor layer may be formed by resistance-heating evaporation, sputtering, spraying, CVD process, and impurity diffusion.

For effective current collection, the transparent conductor layer 204 may be provided with a grid-shaped collector electrode 205 (grid), which may comprise, e.g., Ti, Cr, Mo, W, Al, Ag, Ni, Cu, Sn, or an electroconductive paste, such as silver paste. The collector electrode 205 may be formed by, e.g., sputtering, resistance-heating evaporation or CVD through a mask pattern, formation of a uniform metal film by vapor-deposition followed by etching of unnecessary portions for patterning, direct formation of the grid electrode pattern by photo-CVD, plating through a negative pattern mask for the grid electrode pattern, or printing of an electroconductive paste. The electroconductive paste may ordinarily comprise fine powder of silver, gold, copper, nickel or carbon dispersed within a binder polymer. The binder polymer may comprise, e.g., polyester, epoxy resin, acrylic resin, alkyd resin, polyvinyl acetate, rubber, urethane resin or phenolic resin.

Finally, an output terminal 206 for taking out the electromotive force may be affixed to the electroconductive substrate 201 and the collector electrode 205 by bonding a metal member 207, such as a copper tab, by spot welding, soldering or application of electroconductive paste.

Although, a rather simple solar cell structure has been described with reference-to FIG. 2, a solar cell 101 can have a more complicated structure, e.g., one including a plurality (two or three or more) of semiconductive photoactive layers in lamination for effective photo-electric conversion.

A plurality of solar cells prepared in the above-described manner may be connected in series or in parallel to form a block of solar cells to provide a desired voltage or current. Alternatively, it is also possible to integrate solar cells on an insulated substrate to provide a desired voltage or current.

Process for Preparation of a Solar Cell Module

Hereinbelow, a process is described for producing a solar cell module by using a photo-electricity generating device 101, an inorganic fibrous sheet 12, a filler resin (layer or sheet) 103, a transparent surface film 104, adhesive layers 105, a insulating film 106 and a substrate 107.

In a conventional solar cell module production process, a sequence has been generally adopted such that a sheet-form filler resin 103 is disposed on both surfaces of a photoelectricity generating device 101, and the resultant laminate is subjected to heat-pressure bonding.

In contrast thereto, the solar cell module according to the present invention typically has a laminate structure as shown in FIGS. 1A and 1B. Thus, a stacked structure including a photo electricity generating device 101, an inorganic fibrous sheet 102, a filler resin sheet 103, a surface film 104, adhesive layers 105, an insulating film 106 and a substrate 107 stacked in the order shown in FIG. 1A or in a reverse order, may be subjected to bonding under application of heat and pressure. The order having the surface film 104 on top as indicated in FIG. 1A is preferred because it allows a sufficient coverage of the solar cell 101 with a smaller amount of the filler resin 103.

The heating temperature and time for the pressure bonding may be determined to cause a sufficient degree of crosslinking in the filler resin 103.

The heat-pressure bonding may be performed by an appropriate selection of a double-vacuum ejection system, a single-vacuum ejection system or a roller lamination system, which are presently known. The heat-pressure bonding by the single-vacuum evacuation system is particularly preferred because it allows easy preparation of a solar cell module by using an inexpensive apparatus.

When the substrate 107 comprises a metal sheet, the module sheet after the above-mentioned lamination step may be subjected to bending of its peripheral marginal portion by a bending machine or a roller forming machine to provide a bent edge structure, e.g., as shown in FIG. 1B, suitable for a roofing member or a wall member. FIGS. 5A–5C show some embodiments of the roofing member according to the invention. More specifically, FIG. 5A shows a roofing member 500 having a ridge-side engagement part 501 and an eave-side engagement part 502 that are engaged with each other in an adjacent pair of the members. FIG. 5B shows a roofing member having engaging parts 505 slidably inserted along fixing guide rails 504 fixed on a roof sheathing 503. FIG. 5C shows roofing members each having bent engagement parts 506 on both sides (i.e., in a similar structure as shown in FIG. 1B), so that engagement parts 506 of an adjacent pair of roofing members are secured to each other by being engaged with a cap 507. Each roofing member is equipped with a photo-electricity generating device 500 on its light-receiving surface.

By thinning the filler resin 103 at the bending portion, it is possible to effect a rather complex form of bending and it is also possible to obviate appearance abnormalities such as peeling and whitening. Further, the solar cell module shown in FIG. 1B forms a projecting region where a photo-electricity generating device 101 is disposed so that the device is not readily positioned in the shadow of the bent portion of the module, and the available sunlight time for the module in actual use can be increased to provide an increased electricity generation.

Application to a Ventilating Apparatus

Figure 6:
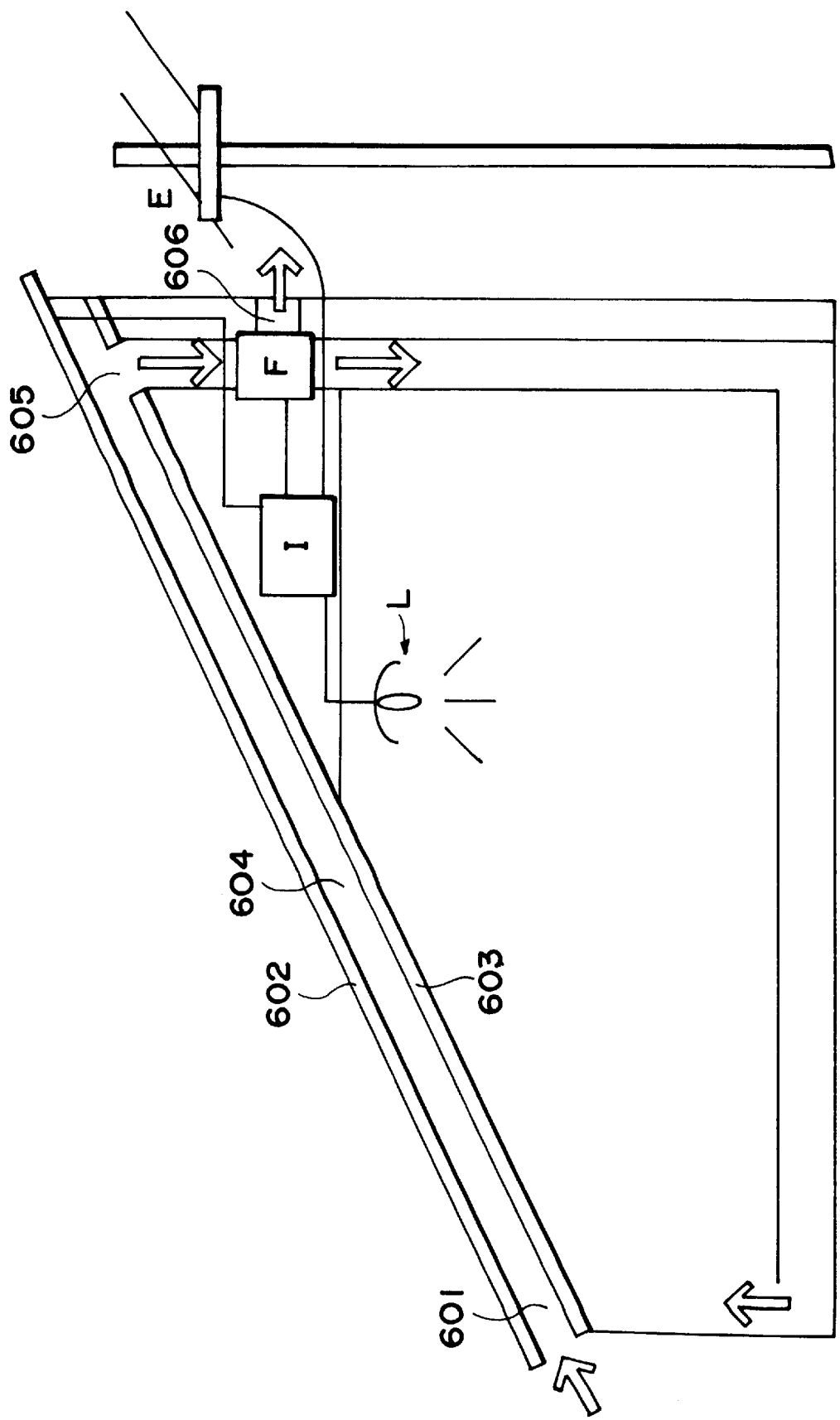
FIG. 6 illustrates an embodiment of the ventilation apparatus according to the invention.

FIG. 6 illustrates an application of a solar cell-integrated roofing member to a ventilating apparatus for a house. In FIG. 6, each arrow represents an air stream, and external air taken through eaves 601 flows through a space 604 between a roofing 602 and a lower sheathing 603 and is taken into the house from a part 605 close to the ridge. Along the air path, a fan F is disposed to provide air flow. The air warmed in the space 604 is taken into the house in a cold season, and discharged through an exhaust port 604 in a hot season to improve the insulation performance of the roof. A heat accumulation means can be disposed under the floor.

Electricity generated in the solar cell-integrated roofing members 602 is introduced into the house through the ridge, converted by an inverter I and consumed by a load L. The inverter I can be linked with a commercial power supply system E.

Hereinbelow, the present invention will be described based on Examples.

EXAMPLE 1

Figure 3:
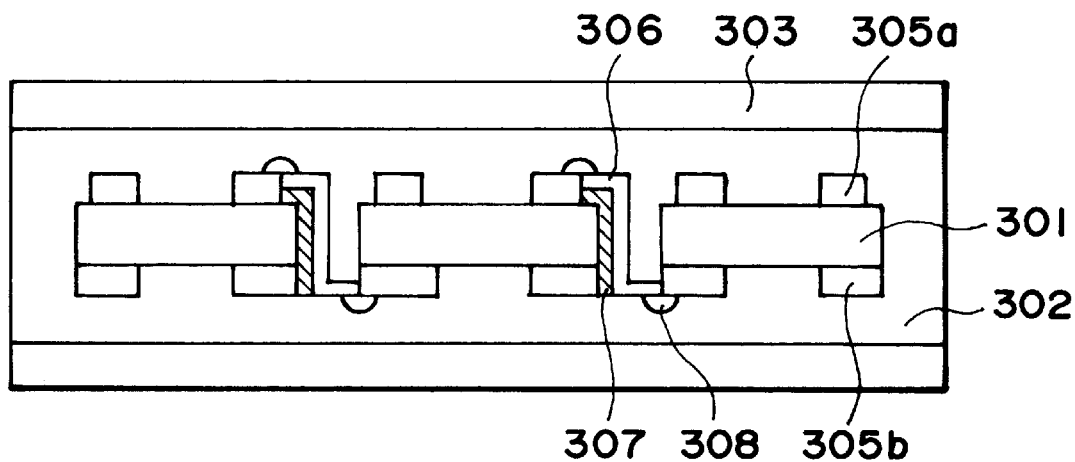
FIG. 3 is a sectional illustration of solar cell modules according to the invention assembled in series.

Amorphous silicon (a-Si) solar cells, each having a laminate structure as shown in FIG. 2, were prepared and formed into a solar cell block as illustrated in FIG. 3. The resultant solar cell block 401 was laminated with other members, as shown in FIG. 4A, to form a solar cell module having a sectional structure, as shown in FIG. 4B.

First of all, a solar cell was prepared in the following manner.

(1) On a cleaned stainless steel substrate 201, a 500 nm-thick Al layer and a 500 nm-thick ZnO layer were sequentially formed by sputtering to provide a back-side reflection layer 202.

(2) According to the plasma CVD process, a tandem-form a-Si photoelectric conversion semiconductor layer 203 having a laminate structure of 15 nm-thick n-layer/400 nm-thick i-layer/10 nm-thick p-layer/10 nm-thick n-layer/80 nm-thick i-layer/10 nm-thick p-layer by forming the n-type a-Si layer(s) from an $SiH_4$—$PH_3$—$H_2$ mixture gas, i-type a-Si layer from an $SiH_4$—$H_2$ mixture gas and the p-type microcrystalline ($\mu$C)-Si layer from an $SiH_4$—$BF_3$—$H_2$ mixture gas.

(3) A transparent conductor layer 204 of 70 nm-thick $In_2O_3$ film was formed by evaporating In by the resistance heating method in an $O_2$ atmosphere.

(4) A collector grid electrode 205 was formed by screen printing of silver paste.

(5) A negative-side terminal 206b of copper tab was affixed onto the stainless steel substrate with a solder 207, and a positive-side terminal 206a in lamination with an insulating tape 208 was affixed onto the collector electrode 205 with a solder 207, to complete the preparation of a solar cell.

Then, a plurality of solar cells prepared through the above-mentioned steps (1)–(5) were connected in series to form a cell block having an external size of 300 mm×1200 mm and thickness of 150 $\mu$m for the active area and 450 $\mu$m for the collector electrode part in a manner as will be described with reference to FIG. 3.

(6) The plurality of solar cells were arranged side by side and, for a pair of mutually adjacent solar cells, a positive-side terminal 305a of one cell and a negative-side terminal 305b of the other cell were connected to each other with a copper tab 306 and a solder 308. In this way, a solar cell block including 5 solar cells connected in series was prepared. In this instance, a copper tab connected to the output terminal of the solar cell disposed at the edge was extended to a back side to be taken out of a hole formed in a back-side coating layer described later.

The cell block prepared above was formulated in a laminate solar cell module in a manner as will be described below with reference to FIG. 4.

(7) A cell block 401 was sandwiched between an inorganic fibrous sheet 402, a filler resin sheet 403 and a transparent film disposed on a light-receiving side, and a back-side integral laminate film 405 and a substrate 406 disposed on a light non-receiving side to form a stacked structure including the members as shown in FIG. 4A.

(8) Then, the stacked structure was placed on a central part of a base plate in a single vacuum chamber-type lamination apparatus. The base plate was rectangular in shape and equipped with a frame-shaped perforated pipe affixed onto a part onto an upper surface along a periphery of the base plate to surround an inner space for accommodating the stacked structure. The perforations in the pipe opened into the inner space and an exhaust port connected to a vacuum pump. The stacked structure was placed in the inner space on the base plate surrounded by the frame-shaped perforated pipe, so that the transparent film 404 was disposed on top, and then covered with a rectangular silicone rubber sheet having an areal size almost equal to that of the base plate to make the inner space accommodating the stacked structure vacuum-tight.

(9) Then, the vacuum pump was operated to evacuate the inner space accommodating the stacked structure. The rubber moved toward the base plate to press the stacked structure onto the base plate. At that time, the inner space was reduced in pressure at a rate of 76 Torr/sec. and then evacuated for 30 min. at 5 Torr.

(10) The base plate carrying the stacked structure covered with the rubber sheet was placed in a hot gas oven preheated to 150° C. and was held for 30 min., thereby melting and crosslinking the EVA of the filler resin sheet 403.

(11) Thereafter, the base plate was taken out of the oven and cooled to 40° C. by supplying air to the plate by a fan, when the evaluation was terminated. Then, the laminated structure constituting a solar cell module was removed.

(12) An excess of the coating material extending out of the substrate was cut off along the edge of the substance, and edges along the longitudinal sides were bent.

(13) An output terminal was preliminarily extended to the back surface of the cell block and, after the lamination, removed from a terminal take-out hole preliminarily formed in the substrate (galvanized steel sheet).

A solar cell module in this Example was thus prepared through the above-mentioned steps (1)–(13). Now, the explanation of the respective members 402–408 used for coating the cell block 401 to form the solar cell module of this Example will be supplemented.

The inorganic fibrous sheet 402 disposed on the light-receiving side comprised 400 $\mu$m-thick non-woven glass fiber sheet having a basis-weight of 80 g/m$^2$, comprising glass fiber of 10 $\mu$m in diameter and containing 4.0 wt. % of binder acrylic resin. The inorganic fibrous sheet 402 had sizes larger than the cell block by 5 mm for each side.

The filler resin sheet 403 comprised 100 wt. parts of ethylene-vinyl acetate copolymer (vinyl acetate content of 33 wt. %, melt-flow rate=30) (filler resin), 1.5 wt. parts of 2,5-dimethyl-2,5 bis(t-butylperoxy)hexane (cross-linking agent), 0.3 wt. part of 2-hydroxy-4-n- octyloxybenzophenone (UV-absorber), 0.2 wt. part of tris (monononylphenyl)phosphite (antioxidant), and 0.1 wt. part of (2,2,6,6-tetramethyl-4-piperidyl)sebacate and was in the form of a 460 μm-thick sheet. The filler resin sheet was used in sizes that were larger than the cell block 401 by 90 mm for each side.

The surface transparent film 404 comprised a 50 μm-thick non-stretched ethylene-tereflouroethylene film, and a surface thereof for adhesion with the filler resin sheet 403 was preliminarily subjected to a plasma treatment. The transparent surface film 404 had sizes larger than the cell block by 90 mm for each side.

The back-side integrated laminate film 405 was a laminate of an insulating film and adhesive layers. The adhesive layers included a 200 μm-thick ethylene-ethyl acrylate layer (indicated as "EEA") and a 25 μm-thick polyethylene layer ("PE"), and the insulating film was a 50 μm-thick biaxially stretched polyethylene terephthalate film ("PET"). These layers were stacked in the order of EEA/PE/PET/PE/EEA to provide a totally 500 μm-thick integrated laminate film 405, that was larger than the cell block 401 by 15 mm for each side.

The substrate 408 comprised a 400 μm-thick galvanized sheet steel (sheet steel plated with Al (55%)/Zn (43.4%)/Si (1.6%) alloy) coated with a polyester paint on one surface and a glass fiber-added polyester paint on the other surface. The substrate sheet 408 was provided in sizes that were larger than those of the cell block 401 by 80 mm for each side.

EXAMPLE 2

A solar cell module was prepared in the same manner as in Example 1, except that the back-side integrated laminate film was replaced by a laminate of EVA/PET/EVA (of 230 μm/100 μm/230 μm), wherein EVA was the same filler resin sheet as the filler resin sheet 403 disposed on the light-receiving side in the module of Example 1, and PET was the same as in Example 1, except for their thicknesses.

EXAMPLE 3

The solar cell module was prepared in the same manner as in Example 1, except for the following modifications.

The sizes of the respective member were changed as follows. The inorganic fibrous sheet 402 was larger by 15 mm for each side, the back-side integrated laminate film 405 was larger by 45 mm for each side, the substrate 406 was larger by 80 mm for each side, and the filler resin sheet 403 and the transparent film 404 were both larger by 90 mm for each side, respectively compared with the cell block 401.

EXAMPLE 4

The solar cell module was prepared in the same manner as in Example 1, except for the following modifications.

A cell block in larger outer sizes of 300 mm×2400 mm was prepared by increasing the number of solar cells connected in series. As the increase in cell block size made the evacuation from the inside of the module difficult, a 100 μm-thick inorganic fibrous sheet (basis weight=20 g/m², binder acrylic resin content=4.0%, glass fiber diameter=10 μm) in a size larger than the cell block by 5 mm for each side was inserted between the cell block and the back-side integrated laminate film.

Comparative Example 1

The solar cell module was prepared in the same manner as in Example 1, except that the sizes of the respective member were changed as follows.

The substrate 406 was larger by 80 mm for each side, and the other members were respectively larger by 90 mm for each side, respectively, compared with the cell block 401.

Comparative Example 2

The solar cell module was prepared in the same manner as in Example 1, except for that the sizes of the respective member were changed as follows.

The inorganic fibrous sheet 402 was larger by 90 mm for each side, the back-side integrated laminate film 405 was larger by 15 mm for each side, the substrate 406 was larger by 80 mm for each side, and the filler resin sheet 403 and the transparent film 404 were both larger by 90 mm for each side, respectively, compared with the cell block 401.

Comparative Example 3

The solar cell module was prepared in the same manner as in Example 1, except that the sizes of the respective member were changed as follows.

The inorganic fibrous sheet 402 was larger by 30 mm for each side, the back-side integrated laminate film 405 was larger by 15 mm for each side, the substrate 406 was larger by 80 mm for each side, and the filler resin sheet 403 and the transparent film 404 were both larger by 90 mm for each side, respectively, compared with the cell block 401.

Comparative Example 4

The solar cell module was prepared in the same manner as in Example 1, except that the sizes of the respective member were changed as follows.

The inorganic fibrous sheet 402 was larger by 5 mm for each side, the back-side integrated laminate film 405 was larger by 90 mm for each side, the substrate 406 was larger by 80 mm for each side, and the filler resin sheet 403 and the transparent film 404 were both larger by 90 mm for each side, respectively, compared with the cell block 401.

Comparative Example 5

A solar cell module was prepared in the same manner as in Example 1, except for using a substrate of FRP (fiber-reinforced plastic) instead of the substrate 406 of the coated galvanized sheet steel used in Example 1.

The solar cell modules prepared in the above-mentioned Examples and Comparative Examples were evaluated with respect to the following items and provided the results shown in Table 1 appearing hereinafter.

(1) Initial Appearance

The appearance of each solar cell module immediately after the preparation in sheet form and before bending was evaluated with eyes according to the following standard.

A: No defect at all in appearance.

B: Some defect in appearance but at a practically acceptable level.

C: Evacuation failure. Substantial defect in appearance, such as curvature of the module.

(2) Appearance After Bending

The appearance of each module after the bending along longitudinal sides thereof was subjected to a naked eye evaluation. The bending was performed in two ways, i.e., upward bending (bending at 90 deg. to the light receiving side (as shown in FIG. 1B)) and downward bending (bending at 90 deg. to the light non-receiving side). The evaluation was performed according to the following standard.

A: No defect at all in appearance.

B: Some defect in appearance but at a practically acceptable level.

C: Substantial defect in appearance, such as whitening and peeling.

(3) High Temperature-high Humidity Test

Each solar cell module was stored for 1000 hours in an environment of 85° C./85% RH and, after removal, the appearance thereof was subjected to a naked eye evaluation according to the following standard.

A: No defect at all in appearance.

B: Some defect in appearance but at a practically acceptable level.

C: Substantial defect, such as peeling, discoloration or curvature of the module.

Each module, two hours after the high temperature-high humidity test, was subjected to a measurement of leakage current under a dry hi-pot condition (leakage current between the cell and the substrate under application of 2200 volts in a dry environment) and a wet hi-pot condition (leakage current for a module dipped in an electrolytic solution having a resistivity of 3000 ohm/cm when 2200 volts are applied between the solar cell and the solution). The leakage current evaluations results are shown in Table 1 according to the following standard.

A: <1 $\mu$A,

B: $\geq$1 $\mu$A and <50 $\mu$A,

C: $\geq$2 50 $\mu$A.

(4) Temperature-humidity Cycle Test

Each solar cell module was subjected to a temperature-humidity cycle test of 100 cycles each including storage at −40° C. for 1 hour and storage at 85° C./85% RH for 20 hours.

After the cycle test, each solar cell module was evaluated with respect to the appearance and the measurement of leakage currents under the dry hi-pot condition and the wet hi-pot condition in the same manners and according to the same standards as after the high temperature-high humidity test described above.

The results of the respective test are inclusively shown in the following Table 1.

TABLE 1

| | Appearance (Ap) | | High temperature/ high humidity test | | | Temperature-humidity cycle test | | |
|---|---|---|---|---|---|---|---|---|
| | Initial | After bending | Ap. | Dry hi-pot | Wet hi-pot | Ap. | Dry hi-pot | Wet hi-pot |
| Ex. 1 | A | A | A | A | A | A | A | A |
| " 2 | A | A | A | A | A | A | A | A |
| " 3 | A | A | A | A | A | A | A | A |
| " 4 | A | A | A | A | A | A | A | A |
| Comp. Ex. 1 | A | C | C | A | C | C | A | C |
| Comp. Ex. 2 | A | C*1 | C | C | C | B | C | C |
| Comp. Ex. 3 | A | A | A | C | C | A | C | C |
| Comp. Ex. 4 | B | A | C | C | C | C | C | C |
| Comp. Ex. 5 | A | A*2 | C | A | A | C | A | A |

*1The module of Comp. Ex. 2 caused whitening after the downward bending.
*2The module of Comp. Ex. 2 was not bendable.

The results of the above-mentioned test shown in Table 1 are supplemented as follows.

(1) All solar cell modules according to Examples showed leakage currents of below 1 $\mu$A respectively after the high temperature-high humidity test and the temperature-humidity cycle test, thus ensuring a sufficient electrical insulation performance. Each module showed good appearance free from defects, such as evacuation failure or peeling, immediately after the preparation and the respective tests. Each module exhibited excellent bendability, thus showing excellent mass-productivity. Each module exhibited excellent non-flammability and was found to be supplicientiy applicable as a solar cell module for installation on the roof or wall.

(2) The module of Comparative Example 1, wherein all the cooling members were extended to the edges of the substrate, resulted in peeling and whitening after bending. Further, as the glass fiber sheet was present up to the edge of the module, the module exhibited substantially inferior electrical insulation in the measurement of leakage current in the wet environment (the wet hi-pot condition) after the high temperature-high humidity test and the temperature humidity cycle test. Further, as the back-side adhesive layers were also extended up to the edge, the module was likely to burn and was rejected by a combustion test.

(3) The module of Comparative Example 2, wherein the non-woven glass fiber cloth was extended up to the substrate edge, resulted in whitening at the bend after downward bending. Further, the module exhibited substantially inferior electrical insulation after the high temperature-high humidity test and the temperature-humidity cycle test.

(4) The module of Comparative Example 3, wherein the non-woven glass fiber cloth was disposed in a large size than the back-side integrated insulating film, resulted in food appearance free from any defects but exhibited substantially inferior electrical insulation after the high temperature-high humidity test, similarly to Comparative Example 1.

(5) The module of Comparative Example 4, wherein the back-side integrated laminated, film was extended up to the substrate edge, resulted in evacuation failure after the lamination, presumably because the surface-side filler resin sheet of EVA and the back-side adhesive layer of the integrated laminate film were bonded in a substantial area without the glass fiber non-woven cloth therebetween. Further, the module caused peeling between the substrate and the adhesive layer at the bend after the high temperature-high humidity test and the temperature-humidity cycle test, presumably because the stress exerted by the insulating film (PET) at the bend.

(6) The module of Comparative Example 5, wherein an FRP was used as the substrate, did not allow bending.

Thus, the above results show that the solar cell modules of the present invention are believed to exhibit high reliability in a long-term use.

What is claimed is:

1. A solar cell module, comprising: a substrate, a photo-electricity generating device, a filler resin sealing the photo-electricity generating device on the substrate, and a surface film covering the filler resin; wherein an insulating film is inserted between the photo-electricity generating device and the substrate so as to be inside all edges of the substrate, an inorganic fibrous sheet is inserted between the photo-electricity generating device and the surface film so as to be disposed inside all edges of the insulating film, and the module is bent at a portion thereof which includes three laminated layers comprising (i) the surface film, (ii) the filler resin and (iii) the substrate, and said portion is free from the insulating film and therefore is also free from the inorganic fibrous sheet.

2. A solar cell module according to claim 1, wherein the inorganic fibrous sheet is disposed to cover an entire area of the photo-electricity generating device.

3. A solar cell module according to claim 1, wherein the filler resin and/or the surface film are disposed in a larger area than the substrate.

4. A solar cell module according to claim 1, wherein the inorganic fibrous sheet comprises non-woven glass fiber cloth.

5. A solar cell module according to claim 1, wherein the insulating film comprises a member selected from the group consisting of polycarbonate, polyethylene terephthalate, and nylon.

6. A solar cell module according to claim 1, wherein an adhesive layer is inserted between the photo-electricity generating device and the insulating film, and/or between the insulating film and the substrate, and the adhesive layer is disposed in an area smaller than that of the filler resins.

7. A solar cell module according to claim 1, wherein said insulating film is provided with adhesive layers on both surfaces thereof to form an integrated laminate film before its insertion between the photo-electricity generating device and the substrate.

8. A solar cell module according to claim 1, wherein another inorganic fibrous sheet is inserted between the photo-electricity generating device and the insulating film so as to be inside all the edges of the insulating film.

9. A roofing member, comprising: a substrate, a photo-electricity generating device, a filler resin sealing the photo-electricity generating device on the substrate, and a surface film covering the filler resin; wherein
an insulating film is inserted between the photo-electricity generating device and the substrate so as to be inside all edges of the substrate,
an inorganic fibrous sheet is inserted between the photo-electricity generating device and the surface film so as to be disposed inside all edges of the insulating film, and
the module is bent at a portion thereof which includes three laminated layers comprising (i) the surface film, (ii) the filler resin and (iii) the substrate, and said portion is free from the insulating film and therefore is also free from the inorganic fibrous sheet.

10. A roofing member according to claim 9, wherein the inorganic fibrous sheet is disposed to cover an entire area of the photo-electricity generating device.

11. A roofing member according to claim 9, wherein the filler resin and/or the surface film are disposed in a larger area than the substrate.

12. A roofing member according to claim 9, wherein the inorganic fibrous sheet comprises non-woven glass fiber cloth.

13. A roofing member according to claim 9, wherein the insulating film comprises a member selected from the group consisting of polycarbonate, polyethylene terephthalate, and nylon.

14. A roofing member according to claim 9, wherein an adhesive layer is inserted between the photo-electricity generating device and the insulating film, and/or between the insulating film and the substrate, and the adhesive layer is disposed in an area smaller than that of the filler resins.

15. A roofing member according to claim 9, wherein said insulating film is provided with adhesive layers on both surfaces thereof to form an integrated laminate film before its insertion between the photo-electricity generating device and the substrate.

16. A process for producing a solar cell module, comprising:
stacking a substrate, an insulating film, a solar cell, an inorganic fibrous sheet, a filler resin layer and a surface film in this order to form a stacked body, wherein said insulating film is disposed inside all edges of the substrate, and the inorganic fibrous sheet is disposed inside all edges of the insulating film,
heating and pressing the stacked body to form a module in the form of an integral laminate sheet having an edge, and
bending a portion of the module along the edge, said portion including three laminated layers comprising (i) the surface film, (ii) the filler resin and (iii) the substrate, which is free from the insulating film of the laminate sheet and therefore said portion is also free from the inorganic fibrous sheet.

17. A process according to claim 16, wherein an adhesive layer is included in the stacked body so as to be inserted between the photo-electricity generating device and the insulating film, and/or between the insulating film and the substrate, and the adhesive layer is disposed in an area smaller than that of the filler resin layer.

18. A process for producing a roofing member, comprising:
stacking a substrate, an insulating film, a solar cell, an inorganic fibrous sheet, a filler resin layer and a surface film in this order to form a stacked body, wherein said insulating film is disposed inside all edges of the substrate, and the inorganic fibrous sheet is disposed inside all edges of the insulating film,
heating and pressing the stacked body to form a module in the form of an integral laminate sheet having an edge, and
bending a portion of the module along the edge, said portion including three laminated layers comprising (i) the surface film, (ii) the filler resin and (iii) the substrate, which is free from the insulating film of the laminate sheet and therefore said portion is also free from the inorganic fibrous sheet.

19. An electricity generating apparatus, comprising a solar cell module and an inverter for converting an output of the solar cell module;
wherein the solar cell module comprises a substrate, a photo-electricity generating device, a filler resin sealing the photo-electricity generating device on the substrate, and a surface film covering the filler resin; wherein
an insulating film is inserted between the photo-electricity generating device and the substrate so as to be inside all edges of the substrate,
an inorganic fibrous sheet is inserted between the photo-electricity generating device and the surface film so as to be disposed inside all edges of the insulating film, and
the module is bent at a portion thereof which includes three laminated layers comprising (i) the surface film, (ii) the filler resin and (iii) the substrate, and said portion is free from the insulating film and therefore is also free from the inorganic fibrous sheet.

20. A roofing method, comprising: fixing a plurality of roofing members onto a roof sheathing by fixing means, and connecting a pair of mutually adjacent roofing members;

wherein each roofing member comprises a substrate, a photo-electricity generating device, a filler resin sealing the photo-electricity generating device on the substrate, and a surface film covering the filler resin; wherein
- an insulating film is inserted between the photo-electricity generating device and the substrate so as to be inside all edges of the substrate,
- an inorganic fibrous sheet is inserted between the photo-electricity generating device and the surface film so as to be disposed inside all edges of the insulating film, and
- the roofing member is bent at a portion thereof which includes three laminated layers comprising (i) the surface film, (ii) the filler resin and (iii) the substrate, and said portion is free from the insulating film and therefore is also free from the inorganic fibrous sheet.

21. A ventilating apparatus, including a roof sheathing, and a plurality of roofing members fixed onto the roof sheathing so as to form a space between the sheathing and the roofing members for introducing external air thereinto, and a path for introducing the air in the space into an inside of a building and/or a path for discharging the air in the space to an outside of the building;

wherein each roofing member comprises a substrate, a photo-electricity generating device, a filler resin sealing the photo-electricity generating device on the substrate, and a surface film covering the filler resin; wherein
- an insulating film is inserted between the photo-electricity generating device and the substrate so as to be inside all edges of the substrate,
- an inorganic fibrous sheet is inserted between the photo-electricity generating device and the surface film so as to be disposed inside all edges of the insulating film, and
- the roofing member is bent at a portion thereof which includes three laminated layers comprising (i) the surface film, (ii) the filler resin and (iii) the substrate, and said portion is free from the insulating film and therefore is also free from the inorganic fibrous sheet.

* * * * *

UNITED STATES PATENT AND TRADEMARK OFFICE
CERTIFICATE OF CORRECTION

PATENT NO. : 6,323,416 B1
DATED : November 27, 2001
INVENTOR(S) : Ayako Komori et al.

It is certified that error appears in the above-identified patent and that said Letters Patent is hereby corrected as shown below:

Title page,
Item [57] ABSTRACT
Line 3, "(generating" should read -- generating --; and
Line 10, "befit" should read -- bent --.

Item [56] References Cited
FOREIGN PATENT DOCUMENTS, "48299 * 7/1991 (JP)" should read
-- 3-48299 * 7/1991 (JP) --.

Column 7,
Line 57, "butyai" should read -- butyral --.

Column 9,
Line 64, "reference-to" should read -- reference to --.

Column 15,
Line 27, "C:≥ 250µA." -- C: ≥ 50µA. --.

Signed and Sealed this

Seventh Day of May 2002

Attest:

*Attesting Officer*

JAMES E. ROGAN
*Director of the United States Patent and Trademark Office*